United States Patent
Watanabe et al.

(10) Patent No.: US 8,044,519 B2
(45) Date of Patent: Oct. 25, 2011

(54) SEMICONDUCTOR DEVICE AND METHOD OF FABRICATING THE SAME

(75) Inventors: Tadayoshi Watanabe, Kanagawa (JP); Takamasa Usui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 12/332,583

(22) Filed: Dec. 11, 2008

(65) Prior Publication Data
US 2009/0152736 A1  Jun. 18, 2009

(30) Foreign Application Priority Data
Dec. 14, 2007  (JP) ................................. 2007-323331

(51) Int. Cl.
*H01L 23/48* (2006.01)

(52) U.S. Cl. . 257/774; 257/751; 257/752; 257/E21.575; 257/E23.173; 257/332; 438/627; 438/586; 438/618; 438/653

(58) Field of Classification Search .................. 438/618, 438/244, 672, 622, 669; 257/751, E21, 758, 257/774, 752, E21.575, E23.173, 332
See application file for complete search history.

(56) References Cited

U.S. PATENT DOCUMENTS

| 7,297,999 | B1 * | 11/2007 | Wang | 257/296 |
|---|---|---|---|---|
| 7,304,384 | B2 | 12/2007 | Koike et al. | |
| 2002/0048942 | A1 * | 4/2002 | Yamaguchi | 438/672 |
| 2002/0123215 | A1 * | 9/2002 | Harada | 438/618 |
| 2007/0059919 | A1 | 3/2007 | Ooka | |
| 2008/0057704 | A1 | 3/2008 | Koike et al. | |
| 2008/0286960 | A1 * | 11/2008 | Shimizu et al. | 438/622 |
| 2009/0155997 | A1 * | 6/2009 | Shinriki et al. | 438/653 |

FOREIGN PATENT DOCUMENTS

JP  2005-277390  10/2005

OTHER PUBLICATIONS

T. Watanabe, et al., "Self-Formed Barrier Technology Using CuMn Alloy Seed for copper Dual-Damascene Interconnect with porous-SiOC/ porous-PAr Hybrid Dielectric", IEEE IITC Proceeding, Jun. 2007, pp. 7-9.

* cited by examiner

*Primary Examiner* — Matthew Smith
*Assistant Examiner* — Wilner Jean Baptiste
(74) *Attorney, Agent, or Firm* — Oblon, Spivak, McClelland, Maier & Neustadt, L.L.P.

(57) ABSTRACT

A method of fabricating a semiconductor device includes forming an insulating film above a semiconductor substrate, forming a concave portion in the insulating film, forming a precursor film including a predetermined metallic element on a surface of the insulating film, carrying out a heat treatment on the precursor film and the insulating film to react with each other, thereby forming an insulative barrier film mainly comprising a compound of the predetermined metallic element and a constituent element of the insulating film in a self-aligned manner at a boundary surface between the precursor film and the insulating film, removing an unreacted part of the precursor film after forming the barrier film, forming a conductive film comprising at least one of Ru and Co on the barrier film, depositing a wiring material film on the conductive film, and forming a wiring from the wiring material film to provide a wiring structure.

11 Claims, 10 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-323331, filed on Dec. 14, 2007, the entire contents of which are incorporated herein by reference.

BACKGROUND

As a conventional method of fabricating a semiconductor device, a method of fabricating a semiconductor device having a wiring structure in which a barrier film for suppressing Cu-diffusion is formed in a self-aligned manner between a wiring main body layer mainly comprising Cu and an interlayer insulating film. For example, Japanese Patent Laid-Open No. 2005-277390 discloses such a method of fabricating a semiconductor device.

This barrier film mainly comprises a compound of a predetermined metallic element such as Mn and a constituent element of the interlayer insulating film. Since this predetermined metallic element easily forms an oxide, when a reactive layer is once formed, a reaction rate of the oxygen from the insulating film with the metallic element becomes extremely slow. Therefore, a substantial reaction does not advance, so that the homogeneous, super thin and stable barrier film is formed between the wiring main body layer and the interlayer insulating film.

According to this method of fabricating a semiconductor device, a Mn—Cu alloy film, for example, is formed in a wiring trench formed at the interlayer insulating film, and a Cu film which is a material of the wiring is deposited thereon. The barrier film is formed between the Mn—Cu alloy film and the interlayer insulating film by carrying out heat treatment on the Mn—Cu alloy film and the Cu film. Simultaneously, Mn diffuses in the Cu film, and is precipitated as the insulating film mainly comprising a Mn oxide at a surface of the Cu film. Mn can be removed from the Cu film by removing the insulating film mainly comprising the Mn oxide.

However, according to this method of fabricating a semiconductor device, since a Cu film is deposited to have a thickness of 0.8 to 1.0 μm, when the insulating film mainly comprising the Mn oxide is precipitated on the surface of the Cu film, a part of Mn does not reach the Cu film surface and may remain within the Cu film. The residual Mn causes the increase in a specific resistance of the wiring as impurity metal.

In addition, according to this method of fabricating a semiconductor device, it is also possible to use a technique of carrying out a heat treatment to form a barrier film before depositing the Cu film on the Mn—Cu alloy film. However, according to this method, the Cu film formed on a surface of the barrier film aggregates when the barrier film is formed, so that a Cu film deposited on the barrier film may be peeled off.

BRIEF SUMMARY

A method of fabricating a semiconductor device according to one embodiment includes: forming an insulating film above a semiconductor substrate; forming a concave portion in the insulating film; forming a precursor film including a predetermined metallic element on a surface of the insulating film in which the concave portion is formed; carrying out a heat treatment on the precursor film and the insulating film to react with each other, thereby forming an insulative barrier film mainly comprising a compound of the predetermined metallic element and a constituent element of the insulating film in a self-aligned manner at a boundary surface between the precursor film and the insulating film; removing an unreacted part of the precursor film after forming the barrier film; forming a conductive film comprising at least one of Ru and Co on the barrier film; depositing a wiring material film on the conductive film; and forming a wiring from the wiring material film to provide a wiring structure.

A semiconductor device according to another embodiment includes; a semiconductor substrate; an insulating film formed above the semiconductor substrate; a wiring formed within the insulating film; a barrier film formed in a self-aligned manner between the wiring and the insulating film; and a conductive film comprising at least one of Ru and Co, the conductive film being formed between the barrier film and the wiring and contacting with the barrier film and the wiring.

DETAILED DESCRIPTION

First Embodiment

Figure 1:
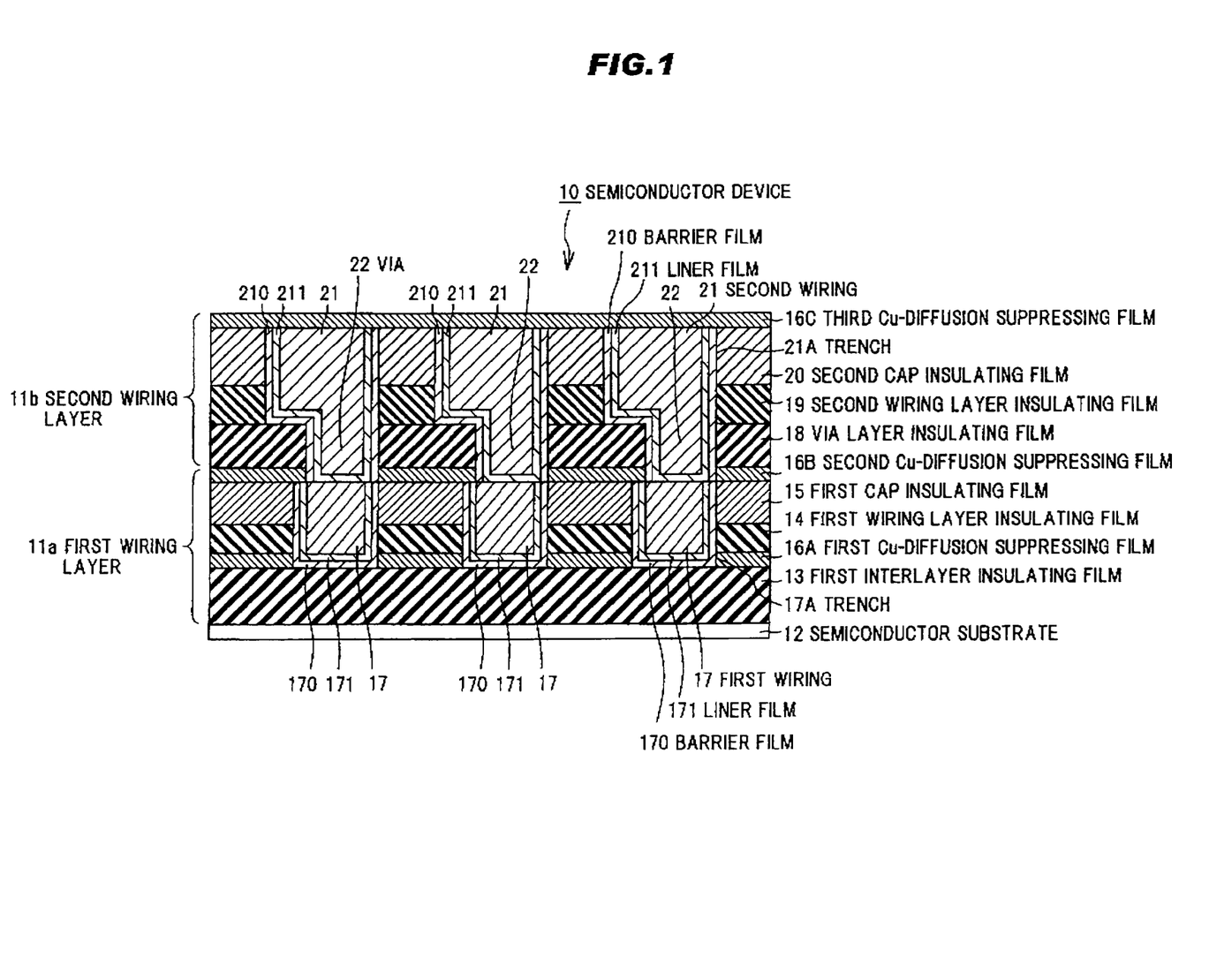
FIG. 1 is a cross sectional view of a semiconductor device in a first embodiment.

FIG. 1 is a cross sectional view of a semiconductor device according to the first embodiment.

A semiconductor device 10 comprises a semiconductor substrate 12, a first wiring layer 11a formed on the semiconductor substrate 12, and a second wiring layer 11b provided on the first wiring layer 11a by dual damascene method. In FIG. 1, the semiconductor device 10 comprises two wiring layers however the present invention is not limited thereto. The number of the wiring layers may be greater than 2.

The first wiring layer 11a comprises a first interlayer insulating film 13, a first Cu-diffusion suppressing film 16A formed on the first interlayer insulating film 13, a first wiring layer insulating film 14 formed on the first Cu-diffusion suppressing film 16A, a first cap insulating film 15 formed on the first wiring layer insulating film 14, a second Cu-diffusion suppressing film 16B formed on the first cap insulating film 15, and a first wiring 17 formed in a predetermined layout from the first wiring layer insulating film 14 to the first cap insulating film 15. A trench 17A is formed from the first Cu-diffusion suppressing film 16A to the first cap insulating film 15, and a bottom surface of the trench 17A reaches an upper surface of the first interlayer insulating film 13.

The first wiring layer insulating film 14 comprises an organic insulating material with a low dielectric constant such as PAr (polyarylene ether) and benzoxazole. This first interlayer insulating film 14 has a thickness of 80 nm, for example.

The first interlayer insulating film 13 comprises an insulating material by which an etching selectivity with the first wiring layer insulating film 14 is increased, such as SiOC, $SiO_2$, SiOCH, and SiOF. This first interlayer insulating film 13 has a thickness of 80 nm, for example.

The first cap insulating film 15 comprises an insulating material such as $SiO_2$, SiC, SiOCH, and SiOC. The first cap insulating film 15 is used as a stopper for a flattening treatment by CMP (Chemical Mechanical Polishing) when forming the first wiring 17.

Each of the first and second Cu-diffusion suppressing films 16A and 16B comprises an inorganic insulating material such as SiCN and SiC in a thickness of 10 to 30 nm, for example. In addition, the Cu-diffusion suppressing film 16A suppresses diffusion of Cu included in the first wiring 17 and functions as an etching stopper at the time of wiring formation.

The first wiring 17 comprises e.g. Cu. In addition, a barrier film 170 is provided between the first wiring 17 and the trench 17A, in order to suppress diffusion of the metal in the first wiring 17 into an insulating film adjacent to the first wiring 17. Further, a liner film 171 having an electric conductivity is provided between the barrier film 170 and the first wiring 17.

The barrier film 170 is formed as follows. For example, Mn in a thickness of 5 to 10 nm is formed in the trench 17A, and the heat treatment is carried out for oxidizing Mn by reacting Mn with oxygen included in the insulating film, further an unreacted metallic film is removed by wet etching, to form a $MnSi_xO_y$ ($x \leq 1$, $y<1$) film or a $MnO_x$ film in a thickness of 2 to 3 nm. As the metal to be formed, CuMn or Mn may be used, for example. In the case that Al is used as the metal to be formed, a reactive layer of $AlO_x$ is formed as the barrier film 170.

As the liner film 171, Ru or Co in a thickness of 5 to 10 nm may be used, for example. The liner film 171 may include both Ru and Co. In the conventional barrier film, Ta, TaN and the like have been used, however, according to the present invention, a conductive film having a smaller wiring specific resistance than a wiring specific resistance of Ta or TaN is used as the liner film. The wiring specific resistance of Ru is 12 μΩ·cm that is lower than the wiring specific resistance of Ta that is 70 μΩ·cm and the wiring specific resistance of TaN that is 180 μΩ·cm. In addition, the wiring specific resistance of Co is 50 μΩ·cm that is lower than the wiring specific resistances of Ta and TaN.

The second wiring layer 11b comprises a via layer insulating film 18 formed on the Cu-diffusion suppressing film 16B, a wiring layer insulating film 19 formed on the via layer insulating film 18, a second cap insulating film 20 formed on the second wiring layer insulating film 19, a second wiring 21 formed in a predetermined layout from the second cap insulating film 20 to the second wiring layer insulating film 19, and a via 22 which electrically connects the second wiring 21 formed on the first wiring 17 with the first interlayer insulating film 13 formed on the via layer insulating film 18.

Herein, the second cap insulating film 20 comprises the same material as that of the first cap insulating film 15. Each of the second wiring 21 and the via 22 comprises the same material as that of the first wiring 17. A trench 21A is formed from the second Cu-diffusion suppressing film 16B to the second cap insulating film 20, and a bottom surface of the trench 21A reaches an upper surface of the first wiring 17. In the trench 21A, a barrier film 210 and a liner film 211 are formed similarly to the barrier film 170 and the liner film 171. The barrier film 210 and the liner film 211 comprise the same materials as those of the barrier film 170 and the liner film 171, respectively.

As the via layer insulating film 18, SiOC in a thickness of 80 nm may be used, for example.

As the second wiring layer insulating film 19, PAr with a dielectric constant of 2.3 may be used, for example.

An example of the method of fabricating a semiconductor device according to the first embodiment will be explained below with reference to FIGS. 2A to 2G.

Figure 2A:
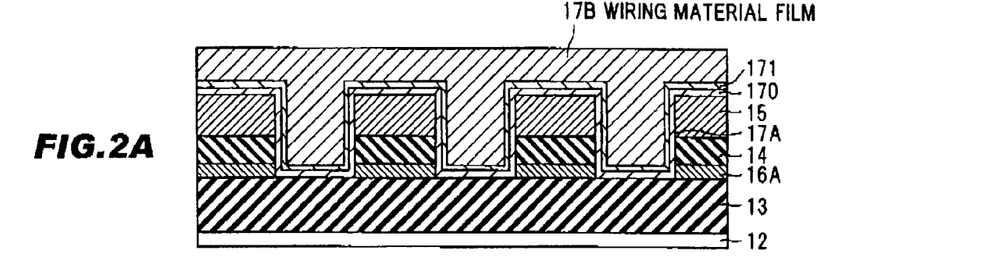
FIGS. 2A to 2G are cross sectional views showing processes for fabricating a semiconductor device according to the first embodiment.

Firstly, as shown in FIG. 2A, the first interlayer insulating film 13, the Cu-diffusion suppressing film 16, the first wiring layer insulating film 14, and the first cap insulating film 15 are sequentially formed on the semiconductor substrate 12, the barrier film 170 mainly comprising a compound of Mn and a constituent element of the insulating film and being formed in a self-aligned manner is provided at a surface of the trench 17A for forming the first wiring 17 to be described later and a surface of the first cap insulating film 15, and the liner film 171 comprising Ru or Co is provided at a surface of the barrier film 170. Next, a wiring material film 173 comprising Cu is formed by electrolytic plating method or the like so as to cover an upper surface of the first cap insulating film 15 a surface of which is covered with the barrier film 170 and a part exposed by the trench 17A.

Figure 2B:
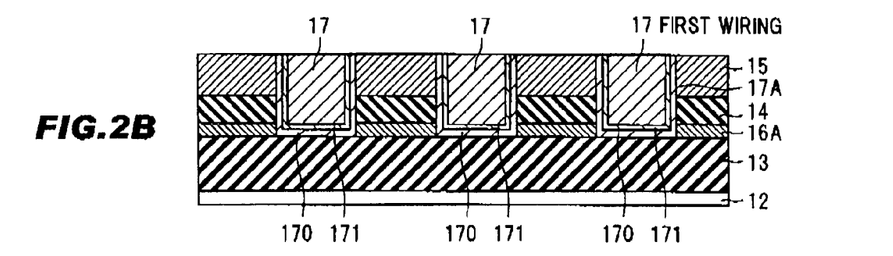

Next, as shown in FIG. 2B, a flattening treatment is carried out on the wiring material film 17B, the barrier film 170 and the liner film 171 by CMP (Chemical Mechanical Polishing) or the like until a surface of the first cap insulating film 15 is exposed, and the wiring material film 17B is processed, to provide the first wiring 17.

Figure 2C:
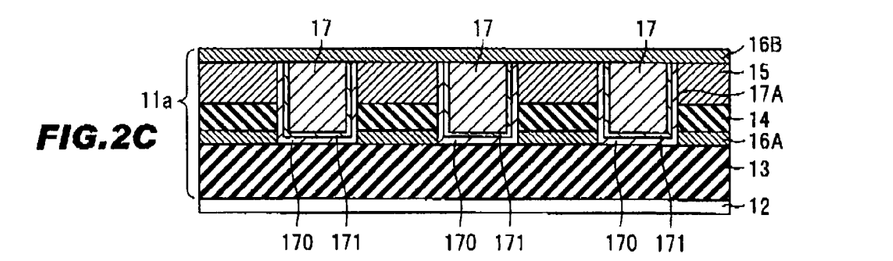

Next, as shown in FIG. 2C, the Cu-diffusion suppressing film 16B is formed to cover an upper surface of the first wiring 17 which is exposed by flattening the surface. As described above, the first wiring layer 11a is formed.

Next, the via layer insulating film 18, the second wiring layer insulating film 19, and the second cap insulating film 20 are sequentially formed on the second Cu-diffusion suppressing film 16B, and the trench 21A as a wiring trench and a via-hole is formed for forming the second wiring 21 and the via 22 to be described later.

Figure 2D:
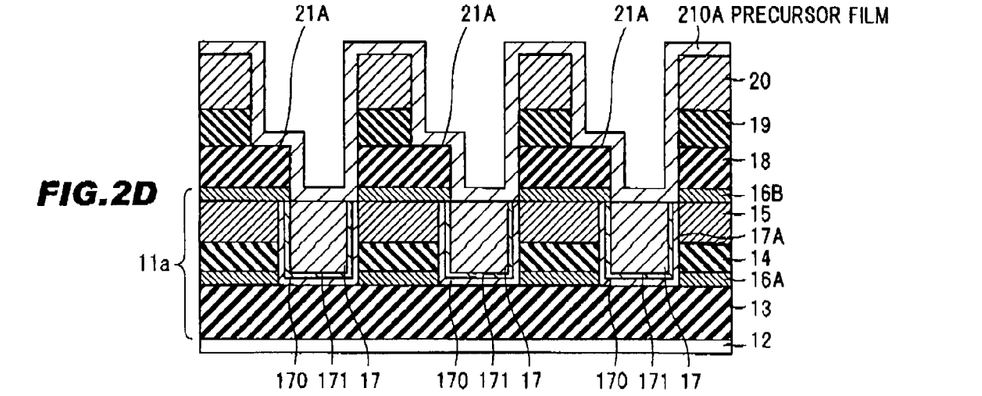

Next, as shown in FIG. 2D, Mn in a thickness of 5 to 10 nm is formed to cover the upper surface of the second cap insulating film 20 and the part exposed by the trench 21A, as a precursor film 210A.

Figure 2E:
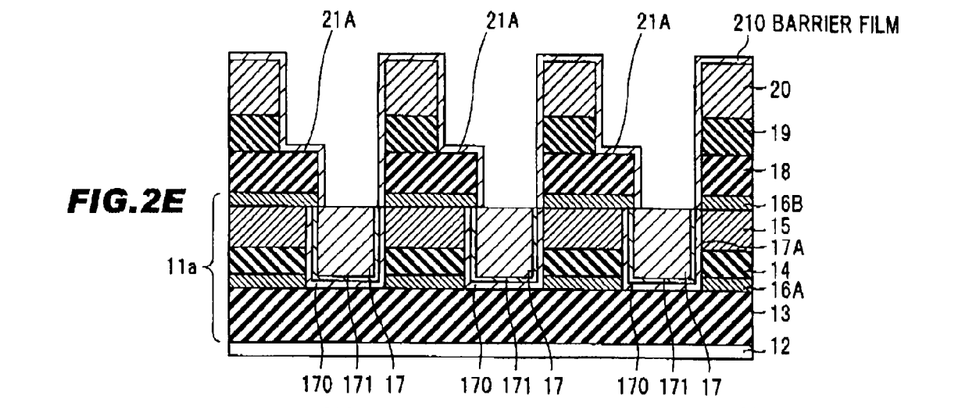

As shown in FIG. 2E, the heat treatment is carried out on the precursor film 210A for example at 200 to 400□ for 30 to 90 minutes. The barrier film 210 in a thickness of 2 to 3 nm is formed by removing an unreacted metallic part of the precursor film 210A after the heat treatment by using HCl or the like. At this time, at a bottom surface of the trench 21A, an upper surface of the first wiring 17 is exposed by removing a part not in contact with the barrier film 210 of the second Cu-diffusion suppressing film 16B by HCl or the like.

Figure 2F:
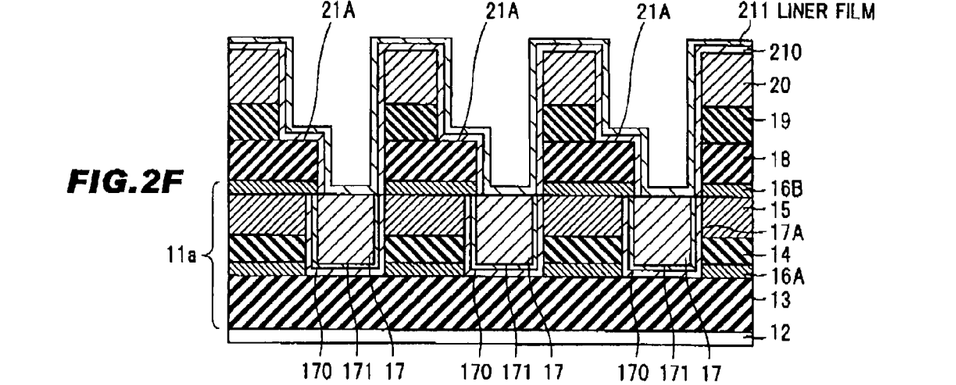

Next, as shown in FIG. 2F, the liner film 211 comprising Ru is formed in a thickness of 5 to 10 nm, so as to cover a surface of the barrier film 210 and an exposed part of the first wiring 17.

Next, a wiring material film (not shown) comprising Cu is formed by the electrolytic plating method, so as to cover an upper surface of the second cap insulating film 20 of which surface is covered with the liner film 211 and a part exposed by the trench 21A.

Figure 2G:
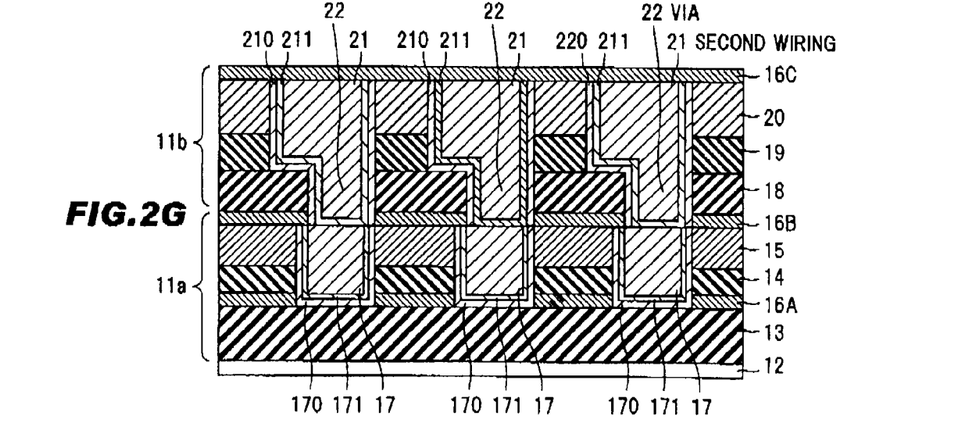

Next, as shown in FIG. 2G, the flattening treatment is carried out on the wiring material film, the barrier film 210 and the liner film 211 by CMP or the like until a surface of the second cap insulating film 20 is exposed, and the wiring material film is processed, to provide the second wiring 21 and the via 22. Thereafter, the third Cu-diffusion suppressing film 16C is formed to cover an upper surface of the second wiring 21 which is exposed by the surface flattening. As described above, the second wiring layer 11b is formed. Further, although it is not shown in the drawings, the semiconductor device 10 is formed by forming an insulating film and the like on the second wiring layer 11b. Herein, the process of depositing the wiring material film and the process of flattening the barrier film 210 and the liner film 211 are similar to those shown in FIGS. 2A and 2B.

According to the semiconductor device 10 in the first embodiment, the water resistance enhancement by the barrier films 170 and 220 can be expected, since the liner films 171 and 211 each comprising Ru with an excellent burying property of Cu composing the wiring are provided inside the barrier films 170 and 220, respectively.

Further, the high reliability can be provided, since the formation of the wiring and the burying of the wiring material in the via-hole part can be well performed by the electrolytic plating method without providing a Cu seed layer by using Ru having the smaller wiring specific resistance than those of Ta and TaN. Accordingly, an excellent burying property is provided even when the via-hole is formed with a high aspect ratio.

Alternatively, in the case that Co is used in another configuration of the liner film, it is possible to provide the semiconductor device with the excellent water resistance and the excellent burying property of Cu.

Therefore, it is preferable that the conductive film to be used as the liner film has a smaller wiring specific resistance than the wiring specific resistance of Ta.

In the first embodiment, the first and second wiring layers 11a and 11b in which the barrier film and the liner film are provided between the metal composing the wiring and the insulating film are explained. However, the present invention is not limited thereto. In the case that only the first wiring 17 is formed in the first wiring layer 11a, since a burying shape of Cu is not complicated and it is possible to provide an enough burying property of the metal composing the wiring, it is possible to provide a configuration in that the liner film is provided in the second wiring layer 11b and the liner film is omitted in the first wiring layer 11a, for example.

Figure 3:
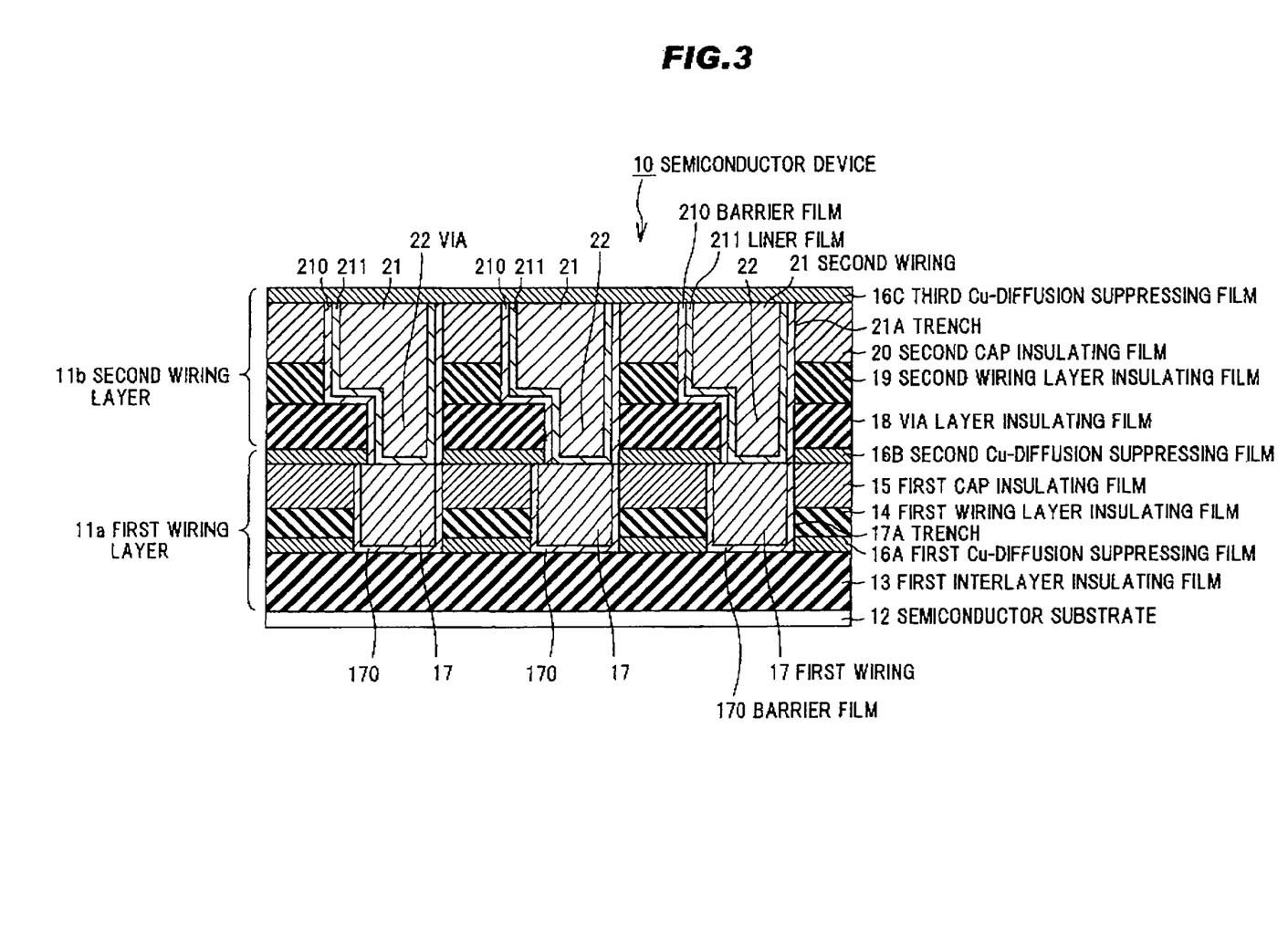
FIG. 3 is a cross sectional view showing another configuration of the semiconductor device according to the first embodiment.

FIG. 3 shows another configuration of the semiconductor device according to the first embodiment. This configuration is different from the semiconductor device 10 shown in FIG. 1, in that the liner film 171 provided from the first wiring layer 11a to outside of the first wiring 17 is omitted. Namely, the first wiring 17 is directly provided on the barrier film 170. Herein, structures of other parts are similar to those in the first embodiment. According to this configuration, it is possible to omit the process associated with manufacturing of the liner film, thereby realizing the cost reduction without losing the burying property of the wiring.

Second Embodiment

Figure 4:
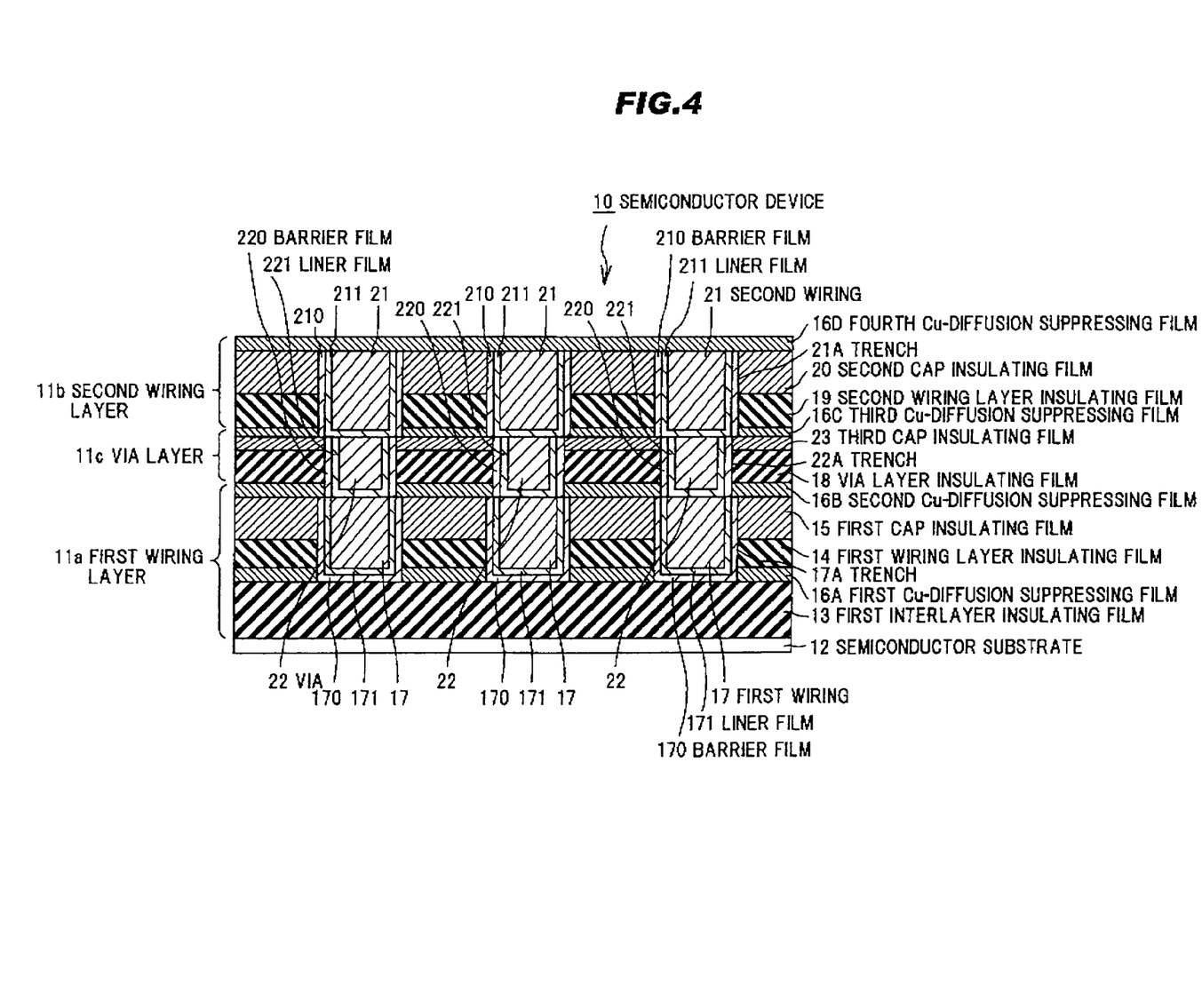
FIG. 4 is a cross sectional view of a semiconductor device in a second embodiment.

FIG. 4 is a cross sectional view of the semiconductor device according to the second embodiment.

This semiconductor device 10 is different from the first embodiment in that a via layer 11c is provided on the first wiring layer 11a formed on the semiconductor substrate 12, and that the second wiring layer 11b having the second wiring 21 is formed on the via layer 11c by single damascene method. Herein, explanation of parts having the structure and function similar to those in the first preferred embodiment is omitted.

FIGS. 5A to 5E are cross sectional views showing processes for fabricating a semiconductor device according to the second embodiment.

Firstly, processes up to the formation of the wiring layer 11a on the semiconductor substrate 12 in the first embodiment as shown in FIGS. 2A and 2B are carried out.

Figure 5A:
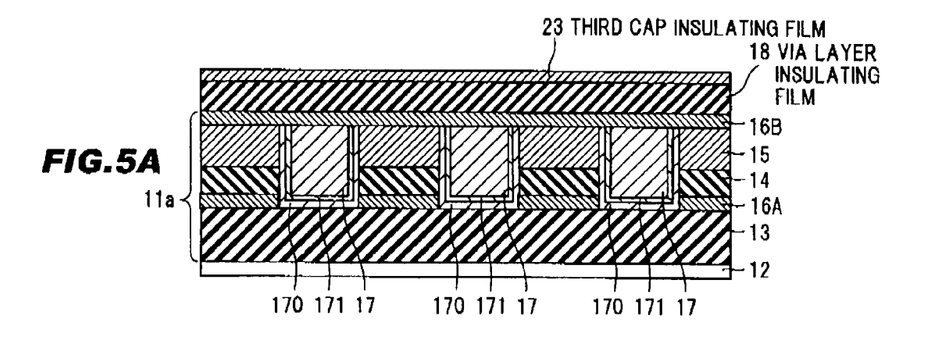
FIGS. 5A to 5E are cross sectional views showing processes for fabricating a semiconductor device according to the second embodiment.

Next, as shown in FIG. 5A, a via layer insulating film 18 and a third cap insulating film 23 are sequentially formed on the first Cu-diffusion suppressing film 16A.

Figure 5B:
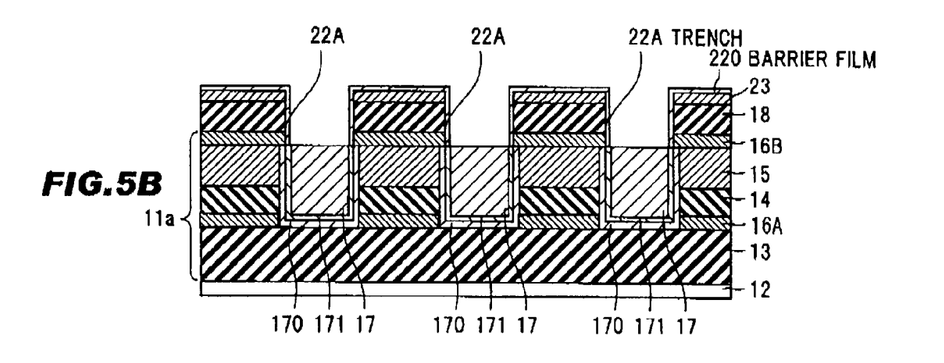

Next, as shown in FIG. 5B, a trench 22A for forming a via 22 to be described later is formed by etching, and Mn in a thickness of 5 to 10 nm is formed to cover an upper surface of the third cap insulating film 23 and a part exposed by the trench 22A, as a precursor film 220A. The heat treatment is carried out on the precursor film 220A similarly to the formation of the first wiring layer 11a, and the barrier film 220 in a thickness of 2 to 3 nm is formed by removing an unreacted metallic part of the precursor film 220A after the heat treatment by using HCl or the like. At this time, at a bottom surface of the trench 22A, an upper surface of the first wiring 17 is exposed by removing a part not in contact with the barrier film 220 of the first Cu-diffusion suppressing film 16A by HCl or the like.

Figure 5C:
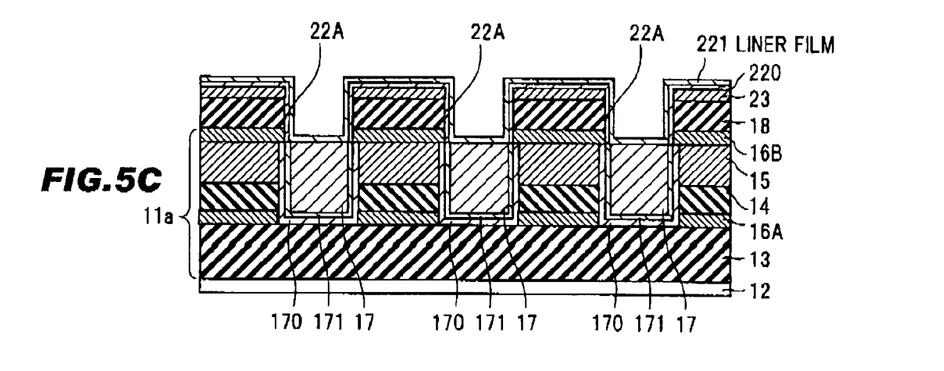

Next, as shown in FIG. 5C, a liner film 221 comprising Ru is formed to cover a surface of the barrier film 220 and the exposed part of the first wiring 17.

Figure 5D:
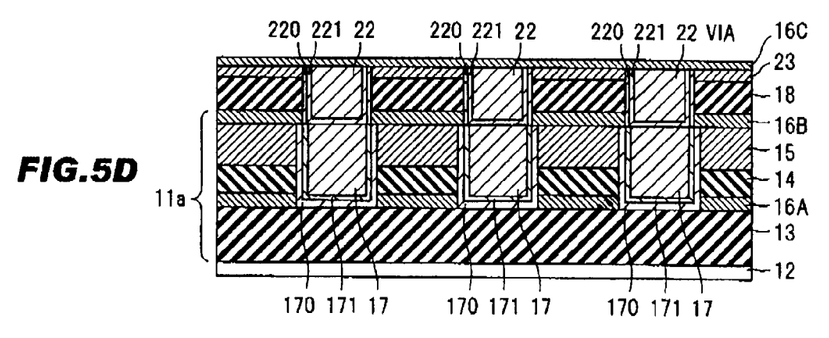

Next, as shown in FIG. 5D, a wiring material film comprising Cu is formed by the electrolytic plating method, so as to cover an upper surface of the third cap insulating film 23 of which surface is covered with the liner film 221 and a part exposed by the trench 22A. Then, a via 22 is formed by carrying out the flattening treatment by the CMP or the like to expose a surface of the third cap insulating film 23, and a third Cu-diffusion suppressing film 16C is formed thereafter to cover an exposed surface of the via 22. As described above, the via layer 11c is formed.

Figure 5E:
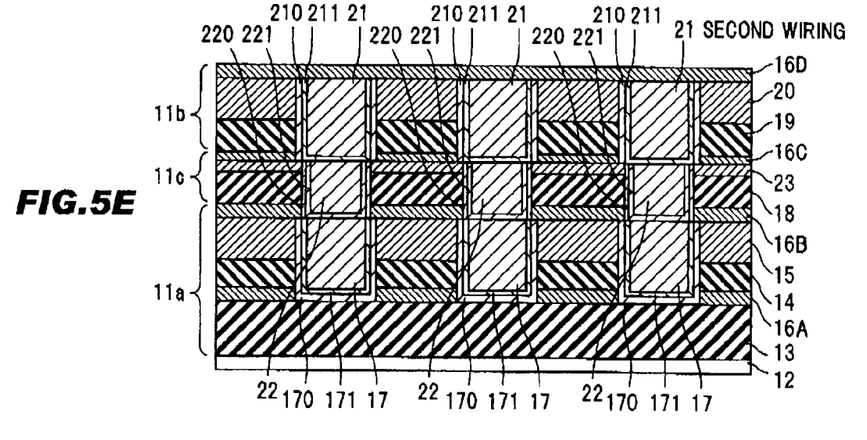

Next, as shown in FIG. 5E, a second wiring layer insulating film 19 and a second cap insulating film 20 are sequentially formed on the third Cu-diffusion suppressing film 16C to form the first wiring 17. Then, the same processes are carried out to provide a fourth Cu-diffusion suppressing film 16D, thereby forming the second wiring layer 11b. Further, although it is not shown in the drawings, the semiconductor device 10 is formed by forming an insulating film and the like on the second wiring layer 11b.

According to the semiconductor device 10 in the second embodiment, it is possible to provide the effect same as that in the first embodiment, even in the case that the first wiring 17, the second wiring 21, and the via 22 are formed by separated processes, respectively.

Third Embodiment

Figure 6:
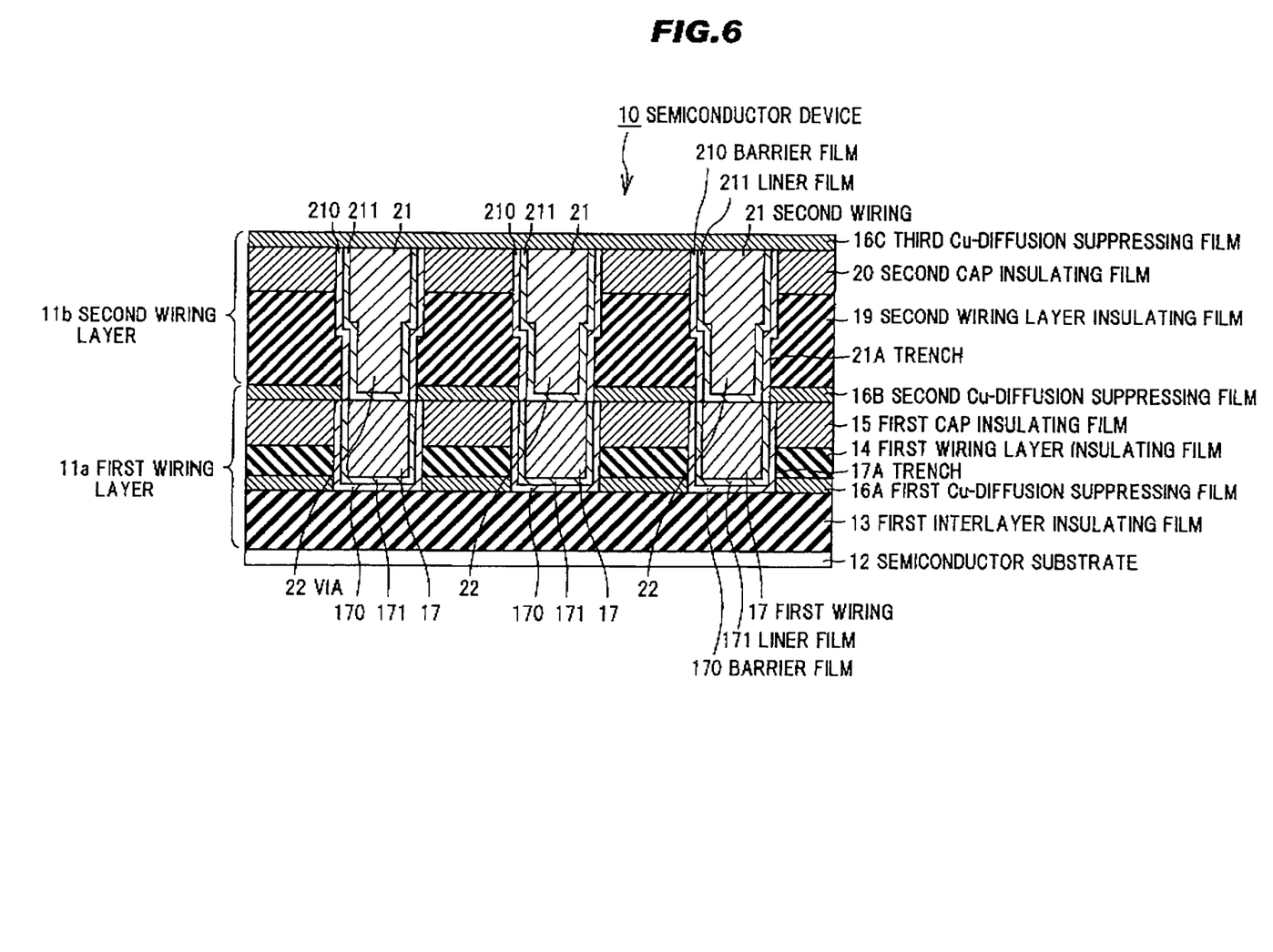
FIG. 6 is a cross sectional view of a semiconductor device in the third embodiment.

FIG. 6 is a cross sectional view of the semiconductor device according to the third embodiment.

In this semiconductor device 10, the second wiring layer 11b is provided on the first wiring layer 11a formed on the semiconductor substrate 12 by the dual damascene method similarly to the first embodiment. This semiconductor device 10 is different from the first embodiment in that an insulating film between the second Cu-diffusion suppressing film 16B and the second cap insulating film 20 is consisted of a single layer of the second wiring layer insulating film 19.

Although the semiconductor device 10 comprises two wiring layers in FIG. 6, however, the number of layers of the wiring layers is not limited to two.

Herein, explanation of parts having the same structure and function similar to those in the first preferred embodiment is omitted.

As the second wiring layer insulating film 19, SiOC with a dielectric constant of 2.0 may be used, for example.

FIGS. 7A to 7E are cross sectional views showing processes for fabricating a semiconductor device according to the third embodiment.

Firstly, the processes up to the formation of the first wiring layer 11a on the semiconductor substrate 12 shown in FIGS. 2A and 2B in the first embodiment are carried out. Thereafter, the second wiring layer insulating film 19 and the second cap insulating film 20 are sequentially formed on the second Cu-diffusion suppressing film 16B.

Figure 7A:
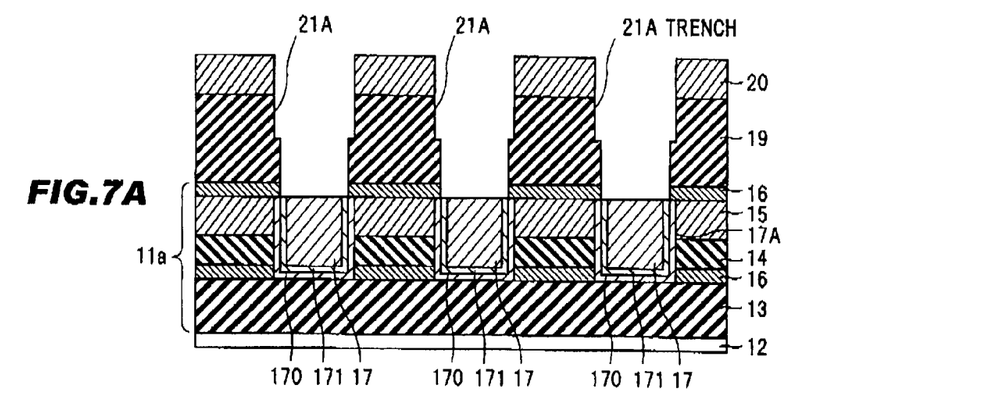
FIGS. 7A to 7E are cross sectional views showing processes for fabricating a semiconductor device in the third embodiment.

Next, as shown in FIG. 7A, a trench 21A for forming a second wiring 21 and a via 22 is formed by etching.

Figure 7B:
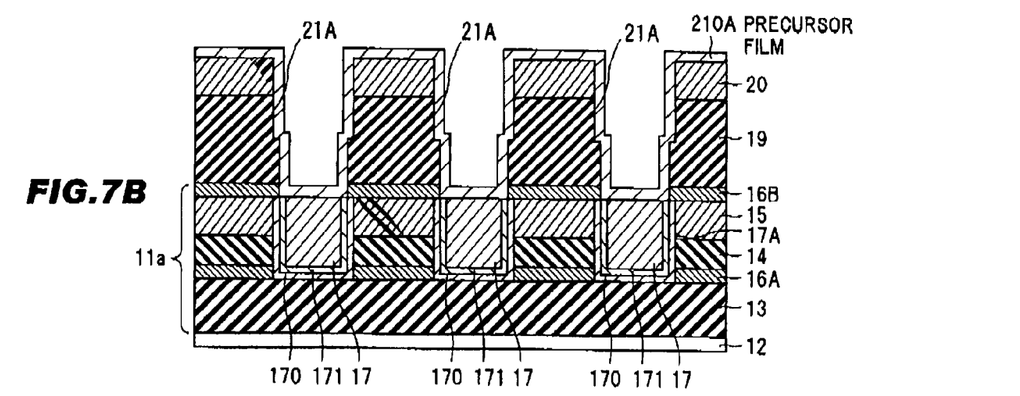

Next, as shown in FIG. 7B, Mn is formed to cover a surface of the second cap insulating film 20 and a part exposed by the trench 21A, as a precursor film 210A.

Figure 7C:
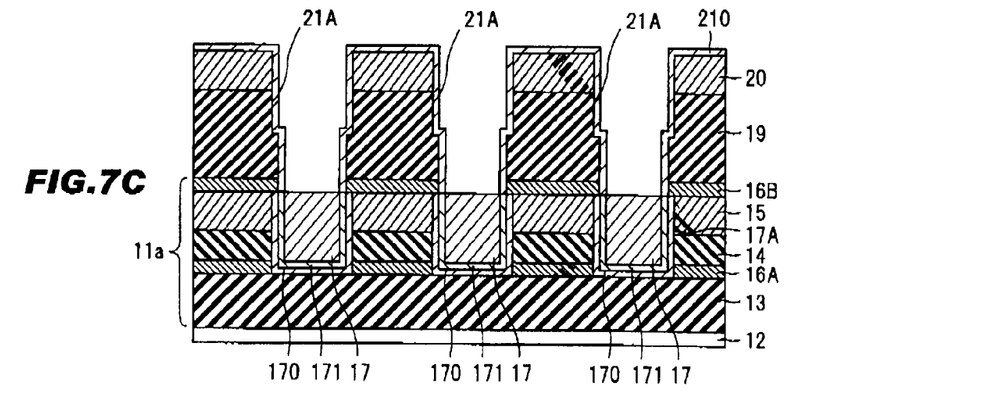

Next, as shown in FIG. 7C, the heat treatment is carried out on the precursor film 210A similarly to the formation of the first wiring layer 11a, and an unreacted metallic part of the precursor film 210A after the heat treatment is removed by using HCl or the like to provide the barrier film 210.

Figure 7D:
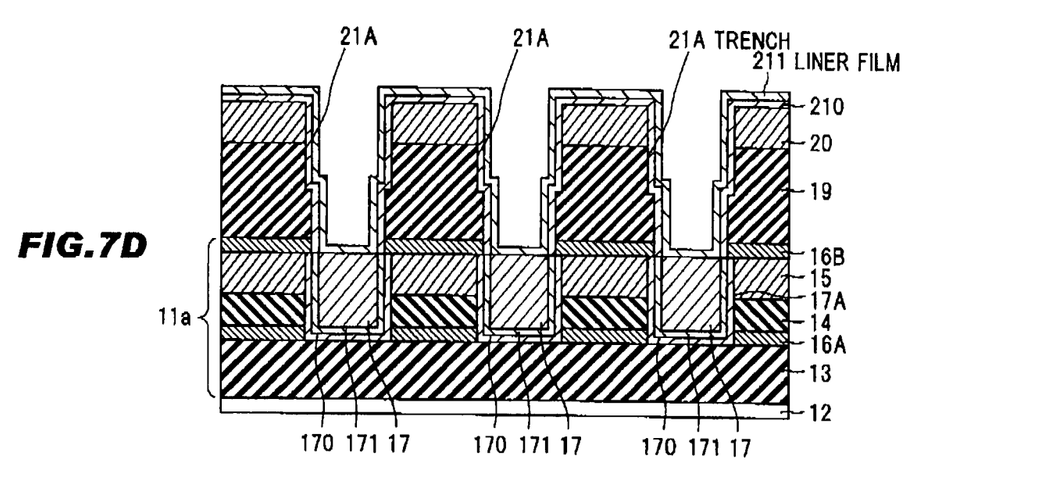

Next, as shown in FIG. 7D, a liner film 221 comprising Ru is formed to cover a surface of the barrier film 220 and the exposed part of the first wiring 17.

Figure 7E:
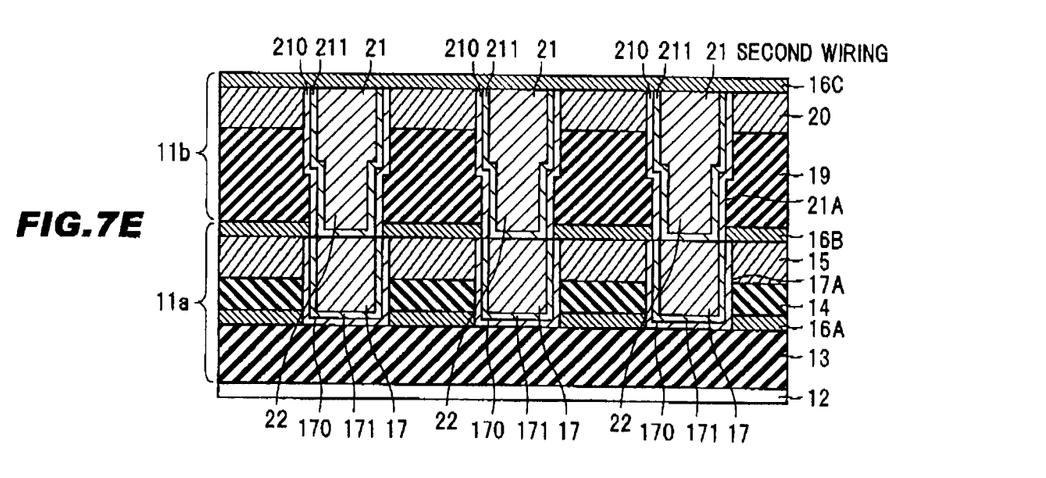

Next, as shown in FIG. 7E, a wiring material film comprising Cu is formed by the electrolytic plating method, so as to cover an upper surface of the second cap insulating film 20 of which surface is covered with the liner film 221 and a part exposed by the trench 21A. Then, the flattening treatment is carried out by the CMP or the like to expose a surface of the second cap insulating film 20, or to expose the insulating film 19 by completely removing the second cap insulating film 20. After the second wiring 21 and the via 22 are formed by the flattening treatment, the third Cu-diffusion suppressing film 16C is formed to cover an exposed part of the second wiring 21. As described above, the second wiring layer 11b is formed. Further, although it is not shown in the drawings, the semiconductor device 10 is formed by forming an insulating film and the like on the second wiring layer 11b.

According to the semiconductor device 10 in the third embodiment, it is possible to provide the effect same as that in the first embodiment by using a different fabrication method.

Other Embodiment

It should be noted that an embodiment is not intended to be limited to the above-mentioned first to third embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device comprising:
   a semiconductor substrate;
   an insulating film formed above the semiconductor substrate, the insulating film including an element;
   a wiring formed within the insulating film;
   a barrier film formed in a self-aligned manner between the wiring and the insulating film, the barrier film contacting with the insulating film, the barrier film including the element; and
   a conductive film comprising at least one of Ru and Co, the conductive film being formed between the barrier film and the wiring and contacting with the barrier film and the wiring.

2. The semiconductor device according to claim 1, wherein the insulating film comprises a plurality of layers comprising different insulating materials, and a layer contacting the barrier film includes at least one layer comprising a silicon oxide in the plurality of layers.

3. The semiconductor device according to claim 1, wherein the barrier film comprises an oxide mainly comprising a compound of a predetermined metallic element and the element.

4. The semiconductor device according to claim 3, wherein the predetermined metallic element comprises Mn or Al.

5. The semiconductor device according to claim 1, wherein the conductive film has a smaller wiring specific resistance than a wiring specific resistance of Ta.

6. The semiconductor device according to claim 1, wherein the wiring comprises at least two wiring structures.

7. The semiconductor device according to claim 6, wherein the wiring structures comprise a first wiring layer and a second wiring layer above the first wiring layer, and the wiring is directly formed on the barrier film in the first wiring layer.

8. The semiconductor device according to claim 6, wherein the wiring structures comprise a first wiring layer and a second wiring layer above the first wiring layer, and the semiconductor device further comprises a via layer provided between the first wiring layer and the second wiring layer.

9. The semiconductor device according to claim 6, wherein the insulating film comprises an inorganic insulating film which suppresses diffusion of metal included in the wiring, a cap insulating film, and a single layer insulating film provided between the inorganic insulating film and the cap insulating film.

10. The semiconductor device according to claim 1, wherein the wiring is formed by using flattening treatment to a material film of the wiring formed in a concave portion in the insulating film, the flattening treatment being carried out until an upper surface of the insulating film is exposed.

11. The semiconductor device according to claim 1, wherein the insulating film comprises a via-hole and a wiring trench on the via-hole;
   the wiring is formed from a material film of the wiring in the wiring trench; and
   a via is formed from the material film in the via-hole.

* * * * *